United States Patent
Choi

(10) Patent No.: US 6,395,581 B1
(45) Date of Patent: May 28, 2002

(54) BGA SEMICONDUCTOR PACKAGE IMPROVING SOLDER JOINT RELIABILITY AND FABRICATION METHOD THEREOF

(75) Inventor: Kwang-Seong Choi, Cheongju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 9 days.

(21) Appl. No.: 09/613,136

(22) Filed: Jul. 10, 2000

(30) Foreign Application Priority Data

Jan. 4, 2000 (KR) .......................................... 2000-130

(51) Int. Cl.7 .............................................. H01L 21/44
(52) U.S. Cl. ....................................... 438/108; 257/778
(58) Field of Search ............................... 419/2; 257/778, 257/684, 781, 701, 668, 622, 669, 774, 783; 438/127, 42, 108

(56) References Cited

U.S. PATENT DOCUMENTS 4,612,160 A * 9/1986 Donlevy et al. ............... 419/2
5,866,949 A * 2/1999 Schueller ..................... 257/778
6,013,946 A * 1/2000 Lee et al. ..................... 257/684
6,144,102 A * 11/2000 Amagai ....................... 257/781
6,201,299 B1 * 3/2001 Tao et al. ..................... 257/701
6,221,697 B1 * 4/2001 Su et al. ....................... 438/127
6,252,298 B1 * 6/2001 Lee et al. ..................... 257/668

* cited by examiner

Primary Examiner—David Nelms
Assistant Examiner—Bau T Le
(74) Attorney, Agent, or Firm—Morgan, Lewis & Bockius LLP

(57) ABSTRACT

A BGA semiconductor package including: a semiconductor chip on which a chip pad is formed; a flexible member formed on the semiconductor chip; a metal pattern formed on one surface of the flexible member; a connection member for electrically connecting the pad and the metal pattern; and an external terminal electrically connected to the metal pattern. A method for fabricating the BGA semiconductor package including the steps of: fabricating a flexible member; forming a metal pattern on one surface of the flexible member; forming a pad on one surface of the semiconductor chip; attaching the flexible member onto the semiconductor chip in a manner that the pad is exposed; electrically connecting the pad and the metal pattern; and attaching an external terminal onto a predetermined region of the metal pattern.

12 Claims, 4 Drawing Sheets

BGA SEMICONDUCTOR PACKAGE IMPROVING SOLDER JOINT RELIABILITY AND FABRICATION METHOD THEREOF

BACKGROUND OF THE INVENTION

1. Field of the Invention

The present invention relates to a semiconductor package, and more particularly, to a BGA semiconductor package improving a solder joint reliability and its fabrication method.

2. Description of the Background Art

Recently, as non-memory products such as a microprocessor or a custom semiconductor (ASIC) are being rapidly requested to be more light and small, a BGA (ball grid array) semiconductor package, in which external terminals in a solder ball form advantageous for multi-pin are arranged at the bottom surface of the package, takes the lead form for semiconductor packages.

Having a concept of a PGA (pin grid array) and of a flip chip, the BGA is able to reduce the area to be occupied by the semiconductor package by approximately 60%, compared to the conventional QFP (quad flat package) semiconductor package, and its electric and heat performance is improved by 40%. Also, it is very competitive in the aspect of expense as the pins are increased in number by more than 300 pins.

The most important thing to be considered in fabricating the BGA semiconductor package is the reliability of the solder joint between the ball grid array and the printed circuit board.

Since the temperature and the thermal expansion coefficient of the ball grid array and the printed circuit board are different to each other, the element is expanded in a different ratio to the printed circuit board.

As a result, whenever the element is turned on or turned off, a high heat cyclic stress is applied to the solder joint formed between the ball grid array and the printed circuit board.

Thus, a reliability of a solder joint that overcomes such a heat cyclic stress applied to the solder joint is one of the critical factors in the development of the BGA package.

The process of fabricating of the conventional BGA adapts a technique of pad re-arrangement utilized for fabrication technique, in which the step of forming a circuit on a wafer through the step of attaching a package ball are overall processed in the fabrication process.

FIGS. 1A through 1E illustrates a sequential process of fabricating the BGA semiconductor package in accordance with the conventional art.

As shown in FIG. 1A, a chip pad 3 is formed on the upper surface of the semiconductor chip 1.

Next, as shown in FIG. 1B, a polymer insulation film 5 having a photosensitivity is coated on the upper surface of the semiconductor chip 1 by using a spin coating method, and then patterned to expose the chip pad 3.

Thereafter, as shown in FIG. 1C, for a pad re-arrangement, a metal film 7 is deposited on the upper surface of the polymer insulation film 5 and the chip pad 3, and then patterned.

And, as shown in FIG. 1D, the solder resist film 9 is coated on the upper surface of the metal film 7 and the polymer insulation film 5 by spin coating method and patterned so as to expose regions of the metal film 7 where the solder balls are to be formed.

And then, as shown in FIG. 1E, solder balls are attached in the regions exposed between the solder resist films 9 of the metal film 7, thereby completing fabrication of the BGA semiconductor package of the conventional art.

Regarding the conventional GBA semiconductor package fabricated as described above, the solder joint reliability is reduced because of the following reasons:

First, the solder ball is generally made in a manner that tin and lead have an eutectic composition. As a result, as shown in FIG. 2, the solder ball 13 is collapsed by the load of the package, causing a reduction in the length (standoff) between the pad 16 of the package and the printed circuit board 15 where the solder ball 13 is attached.

Secondly, as shown in FIG. 2, the interface area between the solder ball 13 and the pad 16 of the package or between the solder ball 13 and the printed circuit board 15 is smaller than the diameter of the solder ball 13.

Accordingly, the thermal stress caused due to the thermal expansion coefficient difference between the package and the printed circuit board is concentrated on the interfaces, resulting in occurrence of cracks 18 in the vicinity of the interface between the solder ball 13 and the pad 16 or between the solder ball 13 and the printed circuit board 15.

Thirdly, since the interface area between the solder ball 13 and the pad 16 or between the solder ball 13 and the printed circuit board 15 is small, an area allowing growth of the crack 18 generated in the vicinity of the interface is accordingly small. Thus, once the crack occurs, the reliability of the solder joint is much degraded even if the crack is not much grown.

Fourthly, in case that mounting the package on both surfaces of the printed circuit board, since the printed circuit board is warped, it is impossible to absorb the stress generated between the ball grid array and the printed circuit board, more deteriorating the reliability of the solder joint.

SUMMARY OF THE INVENTION

Therefore, an object of the present invention is to provide a BGA semiconductor package for which a flexible element is formed to absorb a heat cyclic stress applied to a solder joint formed between a ball grid array and a printed circuit substrate, thereby improving solder joint reliability, and fabrication method thereof.

To achieve these and other advantages and in accordance with the purposed of the present invention, as embodied and broadly described herein, there is provided a BGA semiconductor package including: a semiconductor chip on which a chip pad is formed; a flexible member formed on the semiconductor chip; a metal pattern formed on the upper surface of the flexible member; a connection member for electrically connecting the pad and the metal pattern; and an external terminal electrically connected to the metal pattern.

Having a metal powder, the flexible member serves as a stress buffer or a stress relief that absorbs a stress applied to a solder joint.

In order to accomplish the above object, there is also provided a method for fabricating a BGA semiconductor package including the steps of: fabricating a flexible member; forming a metal pattern on the upper surface of the flexible member; forming a pad on the upper surface of the semiconductor chip; attaching the flexible member onto the semiconductor chip in a manner that the pad is exposed; electrically connecting the pad and the metal pattern; and attaching an external terminal onto a predetermined region of the metal pattern.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
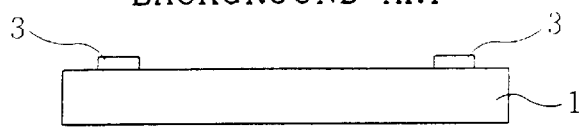
FIGS. 1A through 1E shows sequential process of fabricating a BGA semiconductor package in accordance with a conventional art.
Figure 1B:
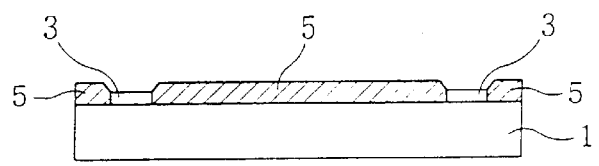
Figure 1C:
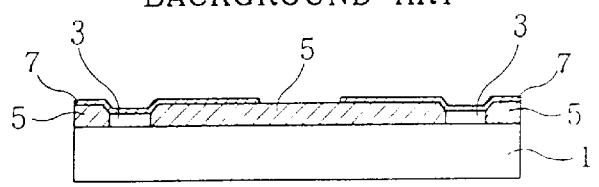
Figure 1D:
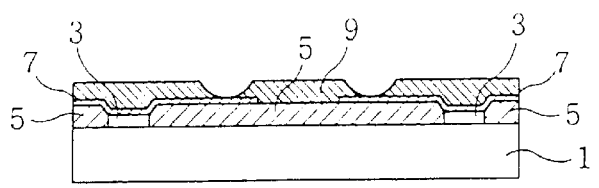
Figure 1E:
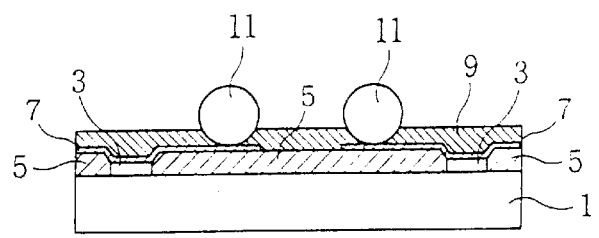
Figure 2:
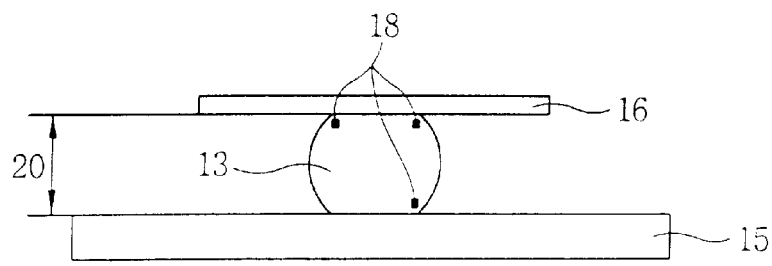
FIG. 2 is a longitudinal-sectional view showing a solder joint of the BGA semiconductor package.
Figure 3:
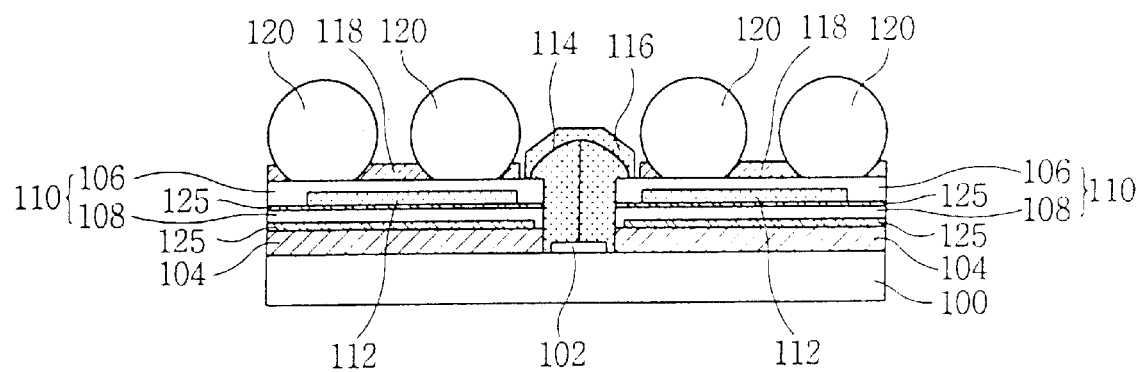
FIG. 3 is a longitudinal-sectional view showing a BGA semiconductor package in accordance with the present invention.

FIG. 3 is a longitudinal-sectional view showing a BGA semiconductor package in accordance with the present invention.

As shown in the drawing, a chip pad 102 formed on the upper surface of a semiconductor chip 100 is exposed between an insulation film 104 that is typically made of a polymer substance.

A flexible member 110 typically made of plastics, constituting the upper substrate 106 and the lower substrate 108, is attached onto the upper surface of the insulation film 104 by an adhesive 125.

A metal powder 112 is positioned within the groove of the flexible member 110.

A metal pattern (not shown) is formed on the upper surface of the flexible member 110, and the metal pattern and the chip pad 102 are electrically connected by a metal wire 114.

The metal wire is sealed by an encapsulant 116.

A solder resist film 118 is formed on the surface of the metal pattern in a manner that a predetermined metal pattern is exposed, and solder balls 120 are attached onto the exposed metal pattern (not shown).

FIGS. 4A through 4D are sequential process of fabricating a flexible member 110 in accordance with the present invention.

As shown in the drawing, the upper substrate 106 typically made of plastics having grooves 200 on its upper surface is mounted on the jig 150.

An electromagnet, a vibrator and a heater are attached on the jig 150.

A metal pattern (not shown) is formed on the lower surface of the upper substrate 106.

Figure 4A:
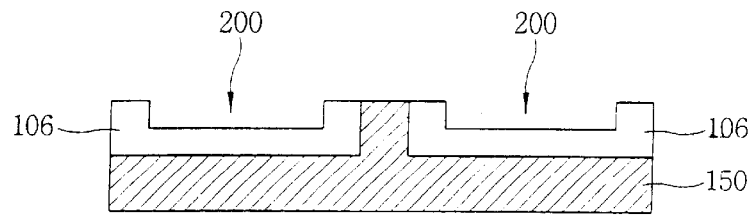
FIGS. 4A through 4D are sequential process of fabricating a flexible member in accordance with the present invention.
Figure 4B:
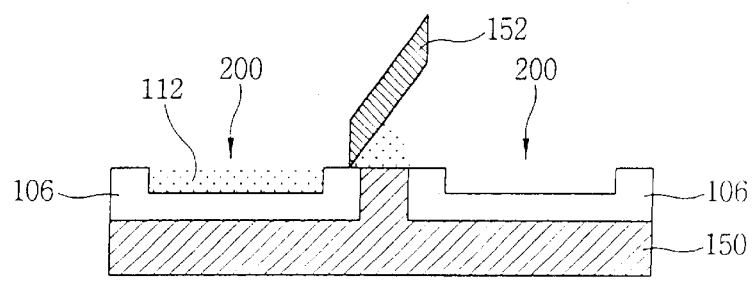

Next, as shown in FIG. 4B, after a magnetic field is taken to be applied onto the jig 150, the metal powder 112 is filled in the groove 200 formed on the upper substrate 106 by using a squeeze.

In the present invention, a metal such as iron on which magnet and an attractive force works is used as the metal powder, and the metal powder is fixed within the groove by the magnetic field.

After the metal powder 112 is filled in the groove 200, the upper substrate is vibrated by means of the vibrator (not shown) so as to improve a filling property, and then, the metal powder 112 is again filled in the groove 200 by using the squeeze 152.

Figure 4C:
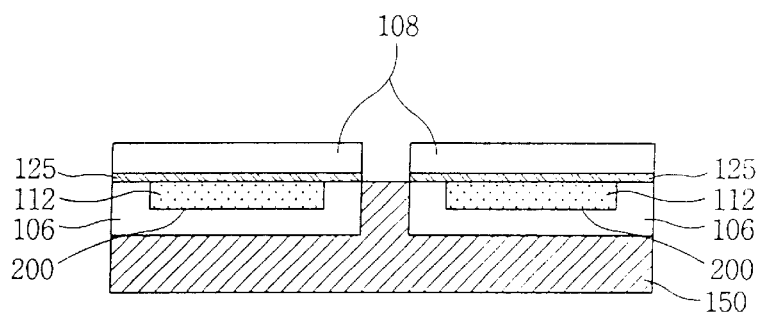

Thereafter, as shown in FIG. 4C, the lower substrate 108 typically made of plastics is attached to the upper surface of the upper substrate 106 having the grooves 200 by using the adhesive 125, and then heated.

In this respect, the adhesive 125 is used as much as enough to wet the metal powder 112.

When the adhesive 125 is hardened, the magnetic field is cut off.

Figure 4D:
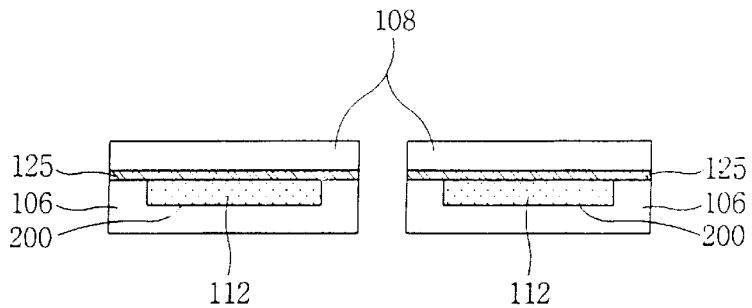

FIG. 4D illustrates the flexible member 110 fabricated by the above method.

FIGS. 5A through 5E are sequential process of fabricating the BGA semiconductor package in accordance with the present invention.

Figure 5A:
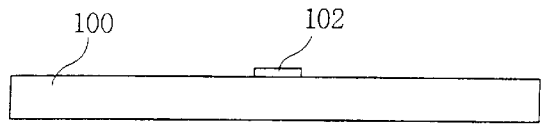
FIGS. 5A through 5E are sequential process of fabricating the BGA semiconductor package in accordance with the present invention.

First, as shown in FIG. 5A, the chip pad 102 is formed on the upper surface of the semiconductor chip 100.

Figure 5B:
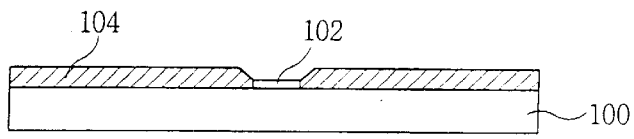

Next, as shown in FIG. 5B, the insulation film 104 made of a polymer having a photosensitivity is formed on the upper surface of the semiconductor chip 100 by the spin coating method and patterned to expose the chip pad 102.

In case of replacing the polymer insulation film 104 with a film having no photosensitivity such as a polyimide film, an additional photoresist film (not shown) is used for patterning the insulation film.

Figure 5C:
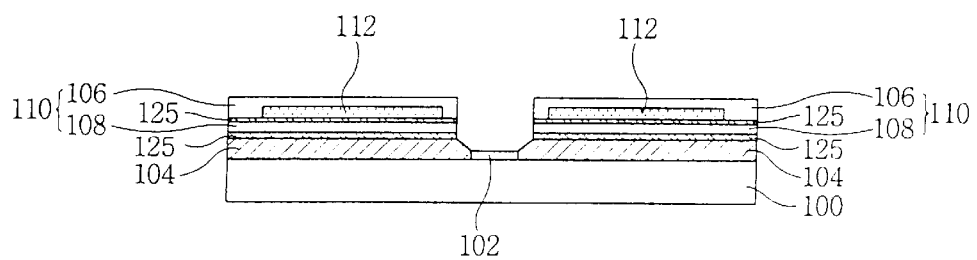

Next, as shown in FIG. 5C, the flexible member 110 as shown in FIG. 4D is attached on the upper surface of the insulation film 104 by using the adhesive 125 in a manner that the metal pattern (not shown) is exposed thereon. Then, the chip pad 102 is exposed between the flexible member 110.

Figure 5D:
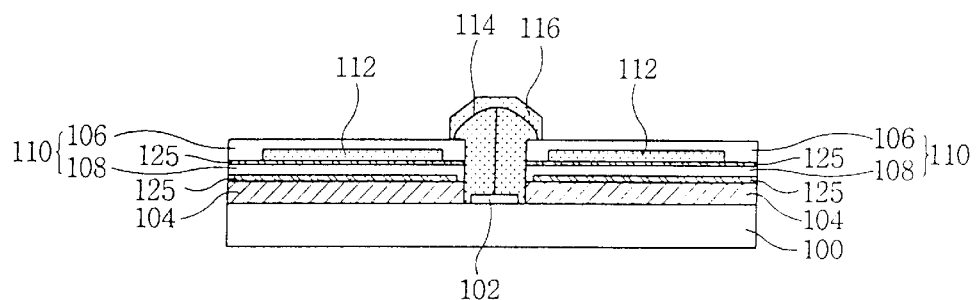

Thereafter, as shown in FIG. 5D, the chip pad 102 and the metal pattern (not shown) are electrically connected by using the metal wire 114.

Subsequently, the metal wire 114 is sealed by the encapsulant 116.

Figure 5E:
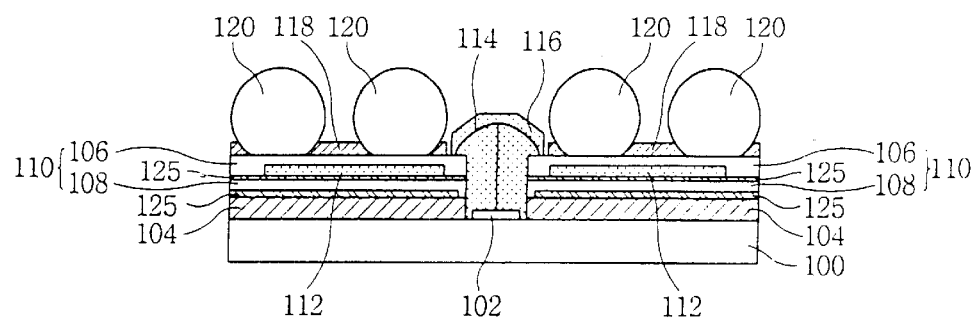

And then, as shown in FIG. 5E, the solder resist film 118 is coated on the upper surface of the flexible member 110 having the metal pattern by using the spin coating method and patterned so that a region of the metal pattern (not shown), where the solder balls are to be formed, is exposed.

Finally, the solder balls 120 are attached on the exposed region of the metal pattern.

Referring to the method for attaching the solder balls 120, the solder balls are attached by using the flux and a reflow process is performed, or a method that the solder is screen-printed is used.

A wafer level packaging is also possible in that the method for fabricating the BGA package of the present invention may be performed before cutting a wafer by chip unit, and the completed package is cut by chip unit.

As so far described, according to the BGA semiconductor package of the present invention, since the flexible member including the metal powder absorbs the heat cyclic stress applied to the solder joint formed between the ball grid array and the printed circuit board, a reliability of the solder joint is much improved.

In addition, even in case that the package is mounted on the both surface of the printed circuit board, the reliability of the solder joint can be improved.

Also, since the metal powder positioned inside the flexible member serves as a floating ground, an inductance is reduced, thereby reducing a noise generated inside the package.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A method for fabricating a BGA semiconductor package comprising the steps of:

fabricating a flexible member by preparing a first substrate having grooves formed at one side, filling metal powder in the grooves, and attaching a second substrate onto one side of the first substrate so as to cover the grooves;

forming a metal pattern on one surface of the flexible member;

forming a pad on the upper surface of the semiconductor chip;

attaching the flexible member onto the semiconductor chip in a manner that the pad is exposed;

electrically connecting the pad and the metal pattern; and attaching an external terminal onto a predetermined region of the metal pattern.

2. The method according to claim 1, wherein the step of filling the metal powder in the grooves is performed by using an instrument for vibrating the first substrate.

3. The method according to claim 1, wherein the step of filling the metal powder in the grooves is performed by using an instrument for applying a magnetic field so as to fix the metal powder.

4. The method according to claim 1, wherein the step of filling the metal powder in the grooves is performed by using a squeeze.

5. The method according to claim 1, wherein the step of forming the metal pattern on the upper surface of the flexible member is performed in a manner that after the metal pattern is formed on the side, of the first substrate, where there is no grooves formed, the flexible member is attached on the semiconductor chip so as for the metal pattern to be positioned on the upper surface of the flexible member.

6. The method according to claim 1, further includes a step of forming an insulation film on the upper surface of the semiconductor chip except for the pad between the step of forming the pad on the upper surface of the semiconductor chip and the step of attaching the flexible member on the semiconductor chip in a manner that the pad is exposed.

7. The method according to claim 1, wherein the external terminal is a solder ball.

8. The method according to claim 7, wherein the step of attaching the solder ball is performed in a manner that the solder ball is attached by using a flux and then a reflow process is performed thereon.

9. The method according to claim 7, wherein the step of attaching the solder ball is performed by using a screen-printing method.

10. A method for fabricating a BGA semiconductor package comprising the steps of:

preparing a first substrate having grooves formed at one side;

filling metal powder in the grooves;

attaching a second substrate onto a first side of the first substrate so as to cover the grooves;

forming a metal pattern on a second side of the first substrate;

forming a pad on the upper surface of the semiconductor chip;

attaching the first and second substrates onto the semiconductor chip in a manner that the pad is exposed;

electrically connecting the pad and the metal pattern; and attaching an external terminal onto a predetermined region of the metal pattern.

11. The method according to claim 10, wherein the step of filling the metal powder in the grooves is performed by using an instrument for applying a magnetic field so as to fix the metal powder.

12. The method according to claim 10, wherein the step of filling the metal powder in the grooves is performed by using a squeeze.

* * * * *